(12) United States Patent
Wilson et al.

(10) Patent No.: US 8,759,228 B2
(45) Date of Patent: Jun. 24, 2014

(54) CHEMISTRY AND COMPOSITIONS FOR MANUFACTURING INTEGRATED CIRCUITS

(75) Inventors: Aaron Wilson, Boise, ID (US); Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1372 days.

(21) Appl. No.: 11/869,407

(22) Filed: Oct. 9, 2007

(65) Prior Publication Data

US 2009/0093125 A1   Apr. 9, 2009

(51) Int. Cl.
*H01L 21/461* (2006.01)

(52) U.S. Cl.
USPC ........... 438/735; 438/706; 438/710; 438/197; 257/E21.483

(58) Field of Classification Search
USPC ........... 438/735, 706, 710, 197; 257/E21.483
See application file for complete search history.

(56) References Cited

U.S. PATENT DOCUMENTS

| | | | |
|---|---|---|---|
| 5,256,244 A | | 10/1993 | Ackerman |
| 5,952,723 A | * | 9/1999 | Takeyasu et al. ............ 257/771 |
| 2001/0055843 A1 | * | 12/2001 | Kim et al. .................... 438/201 |
| 2005/0164479 A1 | * | 7/2005 | Perng et al. .................. 438/591 |
| 2005/0176191 A1 | * | 8/2005 | Kumar et al. ................. 438/197 |
| 2006/0214244 A1 | * | 9/2006 | Minakata ...................... 257/410 |
| 2007/0020936 A1 | | 1/2007 | Abatchev et al. |
| 2007/0045230 A1 | | 3/2007 | Keller et al. |
| 2007/0045693 A1 | | 3/2007 | Manning et al. |
| 2007/0049038 A1 | | 3/2007 | Schrinksy et al. |
| 2008/0064220 A1 | * | 3/2008 | Fernandez et al. ........... 438/706 |
| 2008/0241517 A1 | * | 10/2008 | Kenworthy et al. .......... 428/332 |

OTHER PUBLICATIONS

Baek et al., "Role of O2 in Aluminum Etching with $BCl_3/CL_2/O_2$ Plasma in High Density Plasma Reactor," *Jpn J Appl. Phys.*, Oct. 1999;38:5829-5834.

Kitagawa et al., "Etching of High-*k* dielectric $HfO_2$ Films in BCl3-Containing Plasmas Enhanced with $O_2$ Addition," *Japanese Journal of Applied Physics*, 2006;45(10):L297-300.

* cited by examiner

*Primary Examiner* — Nadine Norton
*Assistant Examiner* — Mahmoud Dahimene
(74) *Attorney, Agent, or Firm* — Wells St. John P.S.

(57) ABSTRACT

In the manufacture of integrated circuits, reactive compositions that include a reactive etchant species and an oxygen-containing species can provide selective removal of target material and can reduce contamination of gas delivery lines.

24 Claims, 1 Drawing Sheet

CHEMISTRY AND COMPOSITIONS FOR MANUFACTURING INTEGRATED CIRCUITS

BACKGROUND

During certain steps in the manufacture of integrated circuits, surface material of, for example, a semiconductor substrate or substrate assembly is removed. Often, photolithographic techniques are used. That is, a surface may be partially masked with the exposed portion of the surface being the area to be removed. Exposed areas of the surface are contacted with a reactive composition in order, for example, to remove a portion of a layer or to form a recess, such as, for example, a contact hole or a via hole in the material.

Dry etching is one example of a process by which surface material can be removed during the manufacture of integrated circuits. Dry etching, sometimes also referred to as plasma etching, can provide, for example, the ability to generate isotropic or anisotropic etch profiles, faithful transfer of lithographically defined photoresist patterns into underlying layers, high resolution, limited handling of dangerous acids and solvents, cleanliness, process control, and ease of automation.

However, components of certain etchant compositions can react to create one or more non-volatile byproduct compounds, which can contaminate gas delivery lines.

DETAILED DESCRIPTION OF ILLUSTRATIVE EMBODIMENTS

Figure 1:
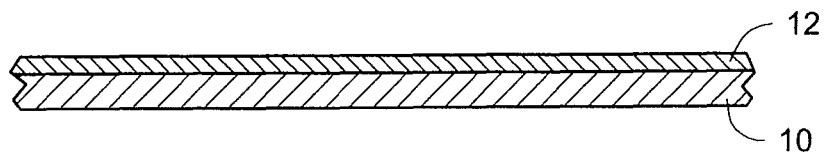
FIG. 1 shows a cross-sectional view of a metal-containing layer deposited on a surface of a substrate assembly.

This disclosure relates, generally, to methods involved in the manufacture of integrated circuits (e.g., memory devices, processors, etc.) such as those used, for example, in consumer products and systems (e.g., cameras, phones, wireless devices, displays, chip sets, set top boxes, games, vehicles, etc.).

Generally, the method includes providing a substrate assembly that includes a metal-containing layer on at least a portion of its surface, providing contact between the metal-containing layer and a reactive composition that includes a reactive etchant species and an oxygen-containing species, allowing the reactive composition and the metal-containing layer to react and form a reaction product, and removing the reaction product.

"Layer," as used herein, is meant to include layers specific to the semiconductor industry, such as, but clearly not limited to, a barrier layer, dielectric layer (i.e., a layer having a high dielectric constant), and conductive layer. The term "layer" is synonymous with the term "film" frequently used in the semiconductor industry. The term "layer" is also meant to include layers found in technology outside of semiconductor technology, such as coatings on glass. For example, such layers can be formed directly on fibers, wires, etc., which are substrates other than semiconductor substrates. Further, the layers can be formed adjacent to (e.g., directly on) the lowest semiconductor surface of the substrate, or they can be formed adjacent to any of a variety of layers (e.g., surfaces) as in, for example, a patterned wafer. As used herein, layers need not be continuous, and in certain embodiments are discontinuous. Unless otherwise stated, as used herein, a layer or material "adjacent to" or "on" a surface (or another layer) is intended to be broadly interpreted to include not only constructions having a layer or material directly on the surface, but also constructions in which the surface and the layer or material are separated by one or more additional materials (e.g., layers).

"Substrate assembly" as used herein refers to a semiconductor substrate having one or more layers, structures, or regions formed thereon. A base semiconductor layer is typically the lowest layer of silicon material on a wafer or a silicon layer deposited on another material, such as, for example, silicon on sapphire. When reference is made to a substrate assembly, various process steps may have been previously used to form or define one or more integrated circuit components. As used herein, the term "integrated circuit component" refers generally to a region, junction, structure, feature, and/or opening such as, for example, a contact (including a first level contact), an electrode, a source, a drain, a transistor, an active area, an implanted region, a via, an interconnect including a local interconnect or an interconnect formed between interlevel dielectric layers, a contact opening, a high aspect ratio opening, a capacitor plate, a barrier for a capacitor, etc.

"Reactive composition" refers to a composition that, under appropriate conditions, can react with a target material of a substrate assembly surface. The term may apply to a composition prior to the application of one or more conditions (e.g., energy) that may be required to initiate reaction between the composition or a component of the composition and the target material.

A wide variety of materials may be used to form the substrate assembly such as, for example, silicon oxide, borophosphosilicate glass (BPSG), silicon such as, e.g., conductively doped polysilicon, monocrystalline silicon, etc. (for this disclosure, appropriate forms of silicon are simply referred to as "silicon", for example in the form of a silicon wafer), tetraethylorthosilicate (TEOS) oxide, spin on glass (i.e., a thin layer of $SiO_2$, optionally doped, deposited by a spin on process), TiN, TaN, W, Ru, Al, Cu, noble metals, etc. A substrate assembly may also contain a layer that includes platinum, iridium, iridium oxide, rhodium, ruthenium, ruthenium oxide, strontium ruthenate, lanthanum nickelate, titanium nitride, tantalum nitride, tantalum-silicon-nitride, silicon dioxide, aluminum, gallium arsenide, glass, etc., and other existing or to-be-developed materials used in constructions, such as, for example, dynamic random access memory (DRAM) devices, static random access memory (SRAM) devices, and ferroelectric memory (FERAM) devices, for example. The layers of a substrate assembly can be formed directly on a surface of the base semiconductor layer, or they can be formed on any of a variety of the layers (i.e., surfaces) as in a patterned wafer, for example.

The metal-containing layer can contain any metal or metal alloy suitable for forming an integrated circuit component. As used herein, a metal-containing layer refers to a layer that may consist entirely of one or more metals, or may also include one or more other elements in addition to the one or more metals. In some embodiments, for example, the metal-containing layer can include a metal oxide such as, for example, $HfO_2$, $ZrO_2$, or $Al_2O_3$.

The metal-containing layer may be formed by any suitable technique including but not limited to atomic layer deposition (ALD), chemical vapor deposition (CVD), electroplating, electroless plating, evaporation, and sputtering.

ALD and CVD are two vapor deposition processes often employed to form thin, continuous, uniform, metal-containing layers onto substrates such as, for example, semiconductor substrates or dielectric layers in a semiconductor device. ALD permits deposition of a single atomic layer of the material being formed. Deposition of metal by ALD can minimize the time temperature exposure necessary to form the intermetallic material.

Generally, using either vapor deposition process, a precursor composition including one or more metals of the intermetallic material is vaporized in a deposition chamber and optionally combined with one or more reaction gases and directed to and/or contacted with the substrate to form a metal layer on the substrate. It will be readily apparent to one skilled in the art that the vapor deposition process may be enhanced by employing various related techniques such as plasma assistance, photo assistance, laser assistance, as well as other techniques.

Generally, ALD involves a series of deposition cycles conducted in a process chamber (i.e., a deposition chamber). Typically, during each cycle, metal atoms are chemisorbed to a deposition surface (e.g., a substrate assembly surface or a previously deposited underlying surface such as material from a previous ALD cycle), forming a monolayer of atoms. Thereafter, if desired, one or more subsequent layers of metal atoms may be deposited by repeating the deposition process until the composition of the metal-containing layer is attained.

ALD, as used herein, is also meant to include processes designated by related terms such as, "chemical vapor atomic layer deposition," "atomic layer epitaxy" (ALE) (see U.S. Pat. No. 5,256,244 to Ackerman), molecular beam epitaxy (MBE), gas source MBE, or organometallic MBE, and chemical beam epitaxy when performed with alternating pulses of precursor composition(s), reactive gas, and purge (e.g., inert carrier) gas.

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Once a metal-containing layer is formed, an integrated circuit component may be formed from the metal-containing layer by removing at least a portion of the metal-containing layer. A portion of the metal-containing layer may be removed by one or more of a variety of processes. One such process is dry etching.

Dry etching is also sometimes referred to as plasma etching. Generally, it includes generating a reactive etchant species in a plasma; diffusing the reactive etchant species to the surface of the material being etched; adsorbing the reactive etchant species on the surface; chemical reaction between the reactive etchant species and the material being etched, forming volatile byproducts; desorbing the byproducts from the surface such as, for example, with the aid of ion bombardment; and diffusing the desorbed byproducts into the bulk of the gas.

Dry etching is typically performed using an apparatus that includes a chamber (e.g., a plasma chamber), a vacuum system, a power supply, and a gas delivery system in fluid communication with the chamber. In some embodiments, the apparatus can further include an end point detector. Wafers to be etched may be loaded into the chamber of the apparatus. The vacuum system is used to reduce the pressure inside the chamber. After a vacuum is established, the chamber is filled with a gaseous reactive composition. A power supply creates a radio frequency field through electrodes in the chamber. The field energizes the gaseous reactive composition to a plasma state. In the energized state, a reactive etchant species of the composition contacts a portion of the surface to be etched, converting the surface material into volatile components that are removed from the system by the vacuum system. In a typical system, the rate at which the reactive composition removes material that is to be etched can vary from about 600 Å/min. to about 2000 Å/min.

Figure 2:
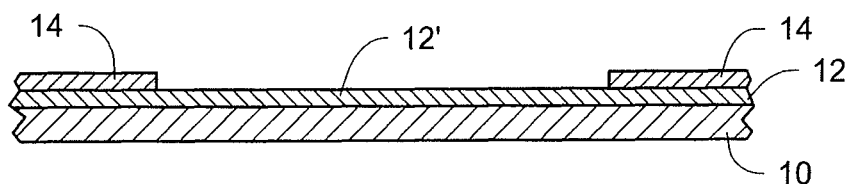
FIG. 2 shows a cross-sectional view of a photoresist layer disposed on the substrate assembly of FIG. 1.
Figure 3:
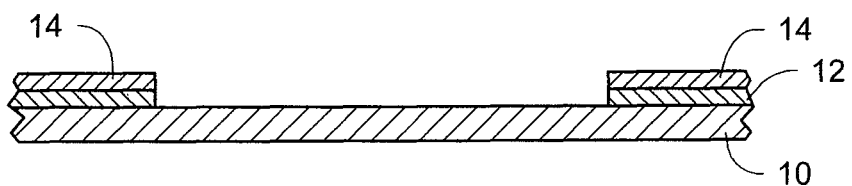
FIG. 3 shows a cross-sectional view of the substrate assembly of FIG. 2 after removal of exposed area of the metal layer.
Figure 4:
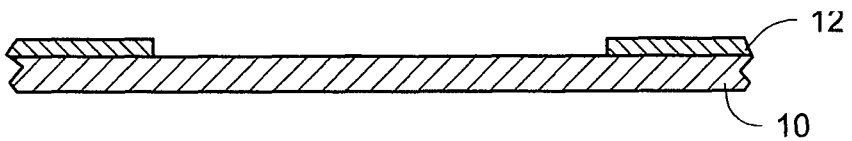
FIG. 4 shows a cross-sectional view of the substrate assembly of FIG. 3 after removal of the photoresist layer.

In some embodiments, the method can include the use of a mask layer (e.g., a photoresist layer). In such embodiments, the mask layer can define a masked portion of the metal-containing layer and an exposed portion of the metal-containing layer. FIG. 1 shows a substrate assembly 10 with a metal-containing layer 12. FIG. 2 shows a mask layer 14 protecting a masked portion of the metal-containing layer 12 from contact with a reactive composition and defines an exposed portion 12' of the metal-containing layer. FIG. 3 shows the substrate assembly of FIG. 2 after contact with a reactive composition that has removed the exposed portion of the metal-containing layer 12. FIG. 4 shows the faithful transfer of the pattern defined by the mask layer 14 in FIG. 2 and FIG. 3 to the metal-containing layer 12.

The selectivity of the reactive etchant species can be important to the dry etching process. Selectivity generally refers to the ability of the reactive etchant species to etch away only the target material intended for removal, while leaving all other nontarget (e.g., photoresist, semiconductor, etc.) materials intact. Selectivity is the ratio of the etch rate of the target material being etched to the etch rate of other target materials. In particular, the reactive etchant species should not react with a mask material that may cover a portion of the surface, thereby protecting that portion of the surface from the etching process. The reactive etchant species also should not react with material beneath the material being etched.

In general, a reactive etchant species of the reactive composition can include one or more the following characteristics: high selectivity against etching the mask material over the layer being etched; high selectivity against etching the material under the layer being etched; high etch rate for the material being removed; and etching uniformity. The reactive etchant species can also be selected to provide a safe, clean, and automation-ready etching process.

As used herein, a reactive etchant species exhibits selectivity if its ratio of etch rates of the metal-containing material and underlying nontarget material or overlying masking material is at least 1.5:1. In some embodiments, the ratio of etch rates of the metal-containing material and nontarget material is at least 2:1. In other embodiments, the ratio of etch rates of the metal-containing material and nontarget material is at least 2.5:1. In still other embodiments, the ratio of etch rates of the metal-containing material and nontarget material is at least 3:1.

Common reactive etchant species include, for example, $BCl_3$, $CCl_4$, $Cl_2$, $SiCl_4$, $CF_4$, $SF_4$, $SF_6$, $SF_8$, $CHF_3$, $C_2F_6$, and $C_3F_8$.

For example, $BCl_3$ is a common reactive etchant species for the dry etching of metal oxides. It is known that adding $O_2$ to the $BCl_3$ to form a reactive composition can increase the selectivity of the etch of, for example, $Al_2O_3$ compared to nontarget materials in a substrate assembly. However, adding $O_2$ to the $BCl_3$ also causes the formation of $B_2O_3$ particles that are non-volatile and, therefore, are deposited in the gas delivery lines of the system. Moreover, this reaction is thermodynamically favored at gas delivery temperature and pressure—i.e., it does not require a plasma to occur. The particles can contaminate the etching system and, therefore, reduce the efficiency of the system.

It has been found that other oxygen-containing species may be added to reactive etchant species such as, for example, $BCl_3$ to form a reactive composition. Such reactive compositions can increase the selectivity of the etch, but avoid deposition of non-volatile byproducts into the gas lines of the system. Without intending to be bound by any theory, suitable oxygen-containing species can dissociate to form oxygen radicals in plasma, which is thought to contribute to the etch selectivity of high dielectric metal oxides versus polysilicon, $SiO_2$, and/or other nontarget layers that may be used in a substrate assembly (e.g., a NAND gate stack).

Suitable oxygen-containing species include, for example, CO, $CO_2$, NO, $N_2O$, $NO_2$, $SO_2$, $H_2O$, or any combination thereof. Under appropriate conditions, such oxygen-containing species can provide good etch selectivity for target metal oxides versus nontarget materials of a substrate assembly. For example, CO can provide an etch ratio of at least 1.5:1 for $Al_2O_3$ to, for example, Si, SiC, $SiO_2$, or $Si_3N_4$.

The reactive composition may be formed by controlling the relative amounts of the reactive etchant species and the oxygen-containing species that are combined to form the reactive composition. Suitable reactive compositions can include a reactive etchant species and an oxygen-containing species in a molar ratio that ranges from about 0.2 to about 2.0.

The reactive composition may be formed by controlling the flow rate of components of the composition into the chamber. Each component of the reactive composition may have different flow rates. In some cases, however, components may have the same flow rate. For example, a reactive composition can include $BCl_3$ as the reactive etchant species and CO as the oxygen-containing species.

Such a composition can be formed by providing the $BCl_3$ at a flow rate of from at least 20 to no more than 500 standard cubic centimeters per minute (sccm). For example, the $BCl_3$ may be provided at a flow rate of at least 20 sccm, at least 40 sccm, at least 60 sccm, or at least 70 sccm. The $BCl_3$ may be provided at a flow rate of no more than 500 sccm, no more than 200 sccm, no more than 100 sccm, no more than 80 sccm, or no more than 50 sccm. In some embodiments, the $BCl_3$ can be provided at a flow rate of from 40 sccm to 80 sccm. In one particular embodiment, the $BCl_3$ can be provided at a flow rate of 50 sccm. In another particular embodiment, the $BCl_3$ can be provided at a flow rate of 60 sccm.

CO can be provided at a flow rate of from at least 1 sccm to no more than 200 sccm. For example, CO can be provided at a flow rate of at least 1 sccm, at least 5 sccm, at least 20 sccm, at least 30 sccm, or at least 50 sccm. CO may be provided at a flow rate of no more than 200 sccm, no more than 60 sccm, no more than 50 sccm, no more than 30 sccm, or no more than 15 sccm. In some embodiments, the CO may be provided at a flow rate of from about 5 sccm to about 15 sccm. In one particular embodiment, the CO is provided at a flow rate of 50 sccm. In another particular embodiment, the CO is provided at a flow rate of 30 sccm.

EXAMPLES

Example 1

50 sccm of CO and 50 sccm of $BCl_3$ were run in an inductively coupled plasma etch chamber (DPS II 200 mm, Applied Materials, Inc., Santa Clara, Calif.) with a 10 minute etch per wafer. Wafers were continually cycled through the chamber for about 4 hours with plasma and then an additional 48 hours without plasma. When the chamber was opened, no evidence of contamination was observed in the gas delivery system (mixed gas line and manifold).

Example 2

Wafers including a high k fence, polysilicon floating gates, and shallow trench isolation (STI) and/or field oxide are cycled through an inductively coupled plasma etch chamber (DPSII G3 300 mm chamber, Applied Materials, Inc., Santa Clara, Calif.) at 5 milliTorr (mTorr), 1200 Watts, and a 50 Volt bias. The wafers are etched using 60 sccm of $BCl_3$, 30 sccm $Cl_2$, and 30 sccm CO in 240 sccm Ar for 30 seconds.

The high k fence is cleared. Polysilicon and STI and/or field oxide consumption (e.g., oxide "coring") is reduced compared to control etches under identical conditions using 60 sccm of $BCl_3$ and 30 sccm $Cl_2$ in 240 sccm Ar for 30 seconds.

The complete disclosures of the patents, patent documents, and publications cited herein are incorporated by reference in their entirety as if each were individually incorporated. Various modifications and alterations to the embodiments described herein will become apparent to those skilled in the art without departing from the scope of the present disclosure. It should be understood that this disclosure is not intended to be unduly limited by the illustrative embodiments set forth herein and that such embodiments are presented by way of example only with the scope of the disclosure intended to be limited only by the claims set forth herein as follows. As used herein, the term "comprising," which is synonymous with "including" or "containing," is inclusive, open-ended, and does not exclude additional unrecited elements or method steps.

What is claimed is:

1. A method of etching a portion of a metal oxide-containing material, comprising:
   providing a substrate assembly having a surface and a metal oxide-containing material on at least a portion of the substrate assembly surface;
   providing contact between the metal oxide-containing material and a reactive composition including a reactive etchant species comprising one or both of $CCl_4$ and $SiCl_4$ and an oxygen-containing species, thereby anisotroprically etching the metal oxide-containing material, a molar ratio of the reactive etchant species to the oxygen-containing species of the reactive composition being from 0.2 to 2.0; and
   the oxygen-containing species comprising one or both of NO and $NO_2$ with the proviso that the oxygen-containing species is not $O_2$.

2. The method of claim 1 wherein the metal oxide comprises $Al_2O_3$ or $HfO_2$.

3. The method of claim 1 wherein the oxygen-containing species further comprises CO, $CO_2$, $N_2O$, $SO_2$, $H_2O$, or any combination thereof.

4. The method of claim 1 wherein the substrate assembly comprises a semiconductor material and the reactive composition is selectively reactive with the metal-containing material compared to the semiconductor material.

5. The method of claim 1 wherein the reactive etchant species further comprises $BCl_3$.

6. The method of claim 1 wherein the reactive etchant species is provided at a flow rate of from at least 20 sccm to no more than 150 sccm.

7. The method of claim 6 wherein the reactive etchant species is provided at a flow rate of 50 sccm.

8. The method of claim 1 wherein the oxygen-containing species is provided at a flow rate of from 1 sccm to no more than 75 sccm.

9. The method of claim 8 wherein the oxygen-containing species is provided at a flow rate of from 5 sccm to 15 sccm.

10. The method of claim 8 wherein the oxygen-containing species is provided at a flow rate of 50 sccm.

11. A method of etching a portion of a metal oxide-containing material, comprising:
    providing a substrate assembly having a surface and a metal oxide-containing material on at least a portion of the substrate assembly surface;
    masking a portion of the metal oxide-containing material to form a masked portion of the metal oxide-containing material and an exposed portion of the metal oxide-containing material;
    contacting the exposed portion of the metal oxide-containing material with a reactive composition including a reactive etchant species comprising one or both of $CCl_4$ and $SiCl_4$ and an oxygen-containing species, thereby anisotropically etching the metal oxide-containing material, a molar ratio of the reactive etchant species to the oxygen-containing species within the reactive composition being from 0.2 to 2.0; and
    the oxygen-containing species comprising one or both of NO and $NO_2$ with the proviso that the oxygen-containing species is not $O_2$.

12. A method of etching a portion of a metal oxide-containing material, comprising:
    providing an apparatus comprising a chamber and a gas delivery system in fluid communication with the chamber;
    providing a substrate assembly having a surface and a metal oxide-containing material on at least a portion of the substrate assembly surface;
    placing the substrate assembly into the apparatus chamber;
    providing a reactive composition to the apparatus chamber via the gas delivery system so that the reactive composition contacts and anisotropically etches the metal oxide-containing material, wherein the reactive composition includes a reactive etchant species comprising one or both of $CCl_4$ and $SiCl_4$ and an oxygen-containing species, a molar ratio of the reactive etchant species to the oxygen-containing species within the reactive composition being from 0.2 to 2.0, and further wherein the etch forms a reactive composition that remains volatile while in the apparatus gas delivery system; and
    removing the reaction product;
    the oxygen-containing species comprising one or both of NO and $NO_2$ with the proviso that the oxygen-containing species is not $O_2$.

13. The method of claim 12 wherein the oxygen-containing species further comprises CO, $CO_2$, $N_2O$, $SO_2$, $H_2O$, or any combination thereof.

14. The method of claim 13 wherein the oxygen-containing species further comprises $SO_2$.

15. The method of claim 13 wherein the oxygen-containing species further comprises $CO_2$.

16. The method of claim 13 wherein the oxygen-containing species further comprises $CO_2$ and $SO_2$.

17. A method of etching a portion of a metal oxide-containing material, comprising:
    providing a substrate assembly having a surface and a metal oxide-containing material on at least a portion of the substrate assembly surface;
    masking a portion of the metal oxide-containing material to form a masked portion of the metal oxide-containing material and an exposed portion of the metal oxide-containing material;
    contacting the exposed portion of the metal oxide-containing material with a reactive composition that includes a reactive etchant species and an oxygen-containing species, a molar ratio of the reactive etchant species to the oxygen containing species within the reactive composition being from 0.2 to 2.0, thereby etching the metal oxide-containing material, the reactive etchant species comprising $CCl_4$, $SiCl_4$, or any combination thereof, the oxygen-containing species comprising $CO_2$, NO, $N_2O$, $NO_2$, $SO_2$, $H_2O$, or any combination thereof; and
    with the proviso that the oxygen-containing species not comprise $O_2$.

18. The method of claim 17 wherein the oxygen-containing species comprises NO, $N_2O$, $NO_2$, or any combination thereof.

19. The method of claim 17 wherein the oxygen-containing species comprises $SO_2$.

20. The method of claim 17 wherein the oxygen-containing species comprises $CO_2$.

21. The method of claim 17 wherein the oxygen-containing species comprises $CO_2$ and at least one of NO, $N_2O$, $NO_2$, $SO_2$, $H_2O$.

22. The method of claim 17 wherein the oxygen-containing species comprises $CO_2$ and at least one of NO, $N_2O$, and $NO_2$.

23. The method of claim 17 wherein the oxygen-containing species comprises $CO_2$ and $SO_2$.

24. The method of claim 17 wherein the oxygen-containing species comprises at least one of NO, $N_2O$, and $NO_2$ and $SO_2$.

\* \* \* \* \*

UNITED STATES PATENT AND TRADEMARK OFFICE
CERTIFICATE OF CORRECTION

| | | |
|---|---|---|
| PATENT NO. | : 8,759,228 B2 | Page 1 of 1 |
| APPLICATION NO. | : 11/869407 | |
| DATED | : June 24, 2014 | |
| INVENTOR(S) | : Aaron Wilson et al. | |

It is certified that error appears in the above-identified patent and that said Letters Patent is hereby corrected as shown below:

On the title page, in item (56), under "Other Publications", in column 2, line 1, delete "$BCl_3/CL_2$" and insert -- $BCl_3/Cl_2$ --, therefor.

In the Claims
In column 6, line 45, in Claim 1, delete "anisotroprically" and insert -- anisotropically --, therefor.
In column 7, line 22, in Claim 11, delete "anisotroprically" and insert -- anisotropically --, therefor.

Signed and Sealed this
Nineteenth Day of August, 2014

Michelle K. Lee
*Deputy Director of the United States Patent and Trademark Office*